United States Patent [19]

Guldi

[11] Patent Number: 5,506,169
[45] Date of Patent: Apr. 9, 1996

[54] METHOD FOR REDUCING LATERAL DOPANT DIFFUSION

[75] Inventor: Richard L. Guldi, Dallas, Tex.

[73] Assignee: Texas Instruments Incorporated, Dallas, Tex.

[21] Appl. No.: 326,268

[22] Filed: Oct. 20, 1994

[51] Int. Cl.$^6$ .............................................. H01L 21/302
[52] U.S. Cl. ........................... 437/70; 437/241; 437/952
[58] Field of Search ............................ 437/69, 70, 238, 437/241, 941, 952

[56] References Cited

U.S. PATENT DOCUMENTS

| | | | |
|---|---|---|---|
| 5,219,783 | 6/1993 | Moslehi | 437/238 |
| 5,286,672 | 2/1994 | Hodges et al. | 437/70 |
| 5,374,584 | 12/1994 | Lee et al. | 437/70 |

OTHER PUBLICATIONS

Ghandhi, "VLSI Fabrication Principles, Silicon & Gallium Arsenide", 1983, pp. 420–424, 427–429.
Ahn, S. T., et al., *Reduction of Lateral Phosphorus Diffusion in CMOS n-Wells*, IEEE Transactions on Electron Devices, vol. 37 No. 3, Mar. 1990, pp. 806–807.
Wong, S. S. and Ekstedt, T. W., *CMOS Well Drive-In in $NH_3$ for Reduced Lateral Diffusion and Heat Cycle*, IEEE Electron Device Letters, vol. EDL-6, No. 12, Dec. 1985, pp. 659–661.
Ahn, S. T., et al., *Film stress–related vacancy supersaturation in silicon under low–pressure chemical vapor deposited silicon nitride films*, J. Appl. Phys. 64(10), Nov. 1988, pp. 4914–4919.

*Primary Examiner*—Chandra Chaudhari
*Attorney, Agent, or Firm*—Paul C. Hashim; W. J. Brady, III; Richard L. Donaldson

[57] ABSTRACT

A process is disclosed for inhibiting lateral diffusion of dopants in a semiconductive material. At least one conductivity dependent region is formed in the semiconductor, and a blocking layer is provided in overlying relation with the conductivity dependent region. Interstitial sites or vacancies are introduced into the conductivity dependent region in accordance with the diffusion mechanism of a selected dopant, and dopant is diffused into the semiconductor in a direction that is substantially transverse to the semiconductor upper surface while inhibiting with the introduced interstitial sites or vacanies lateral diffusion of the dopant into the conductivity dependent region.

13 Claims, 3 Drawing Sheets

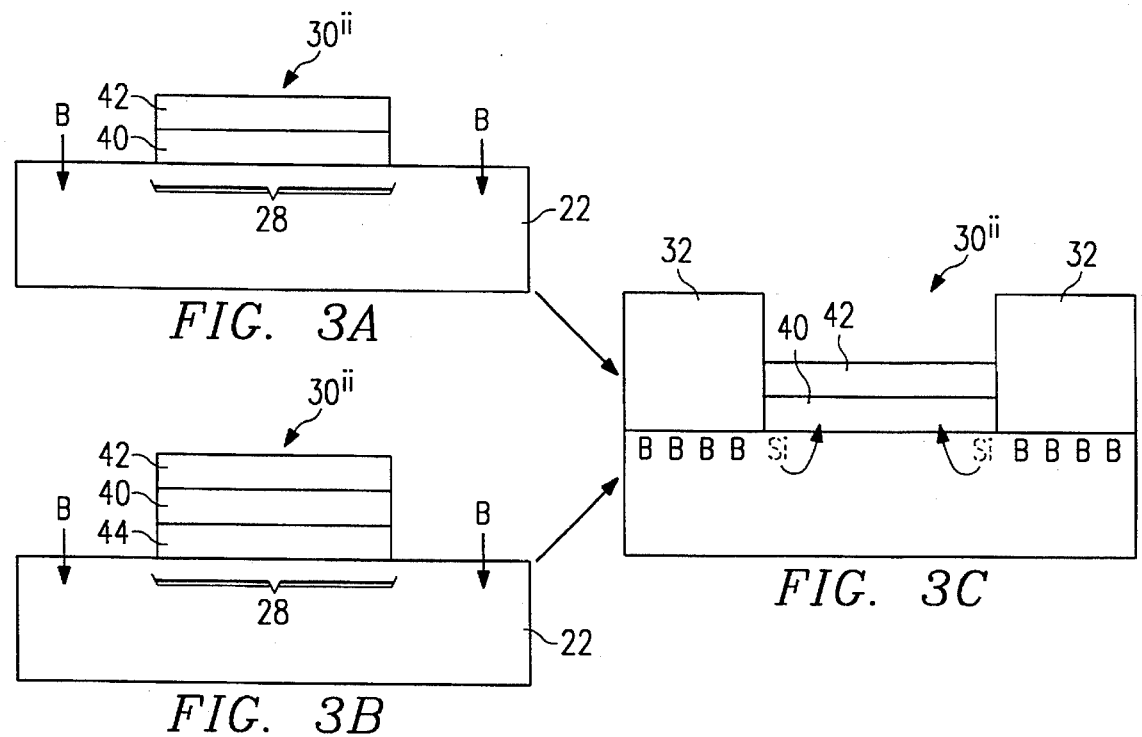
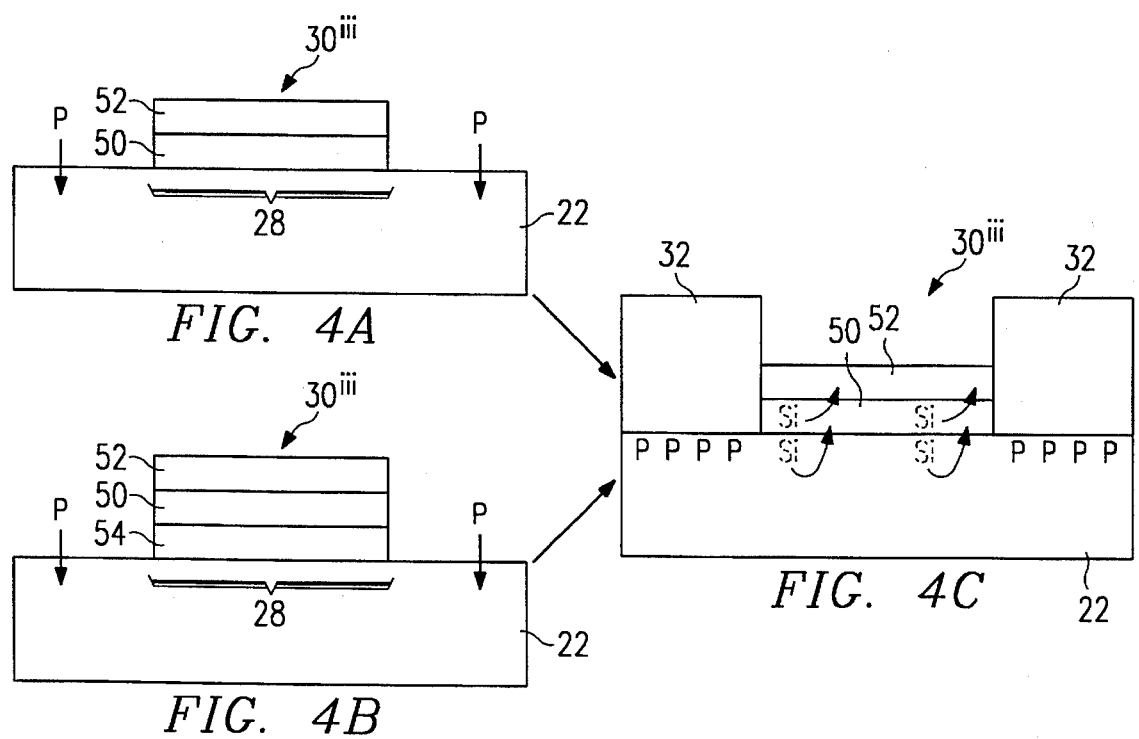

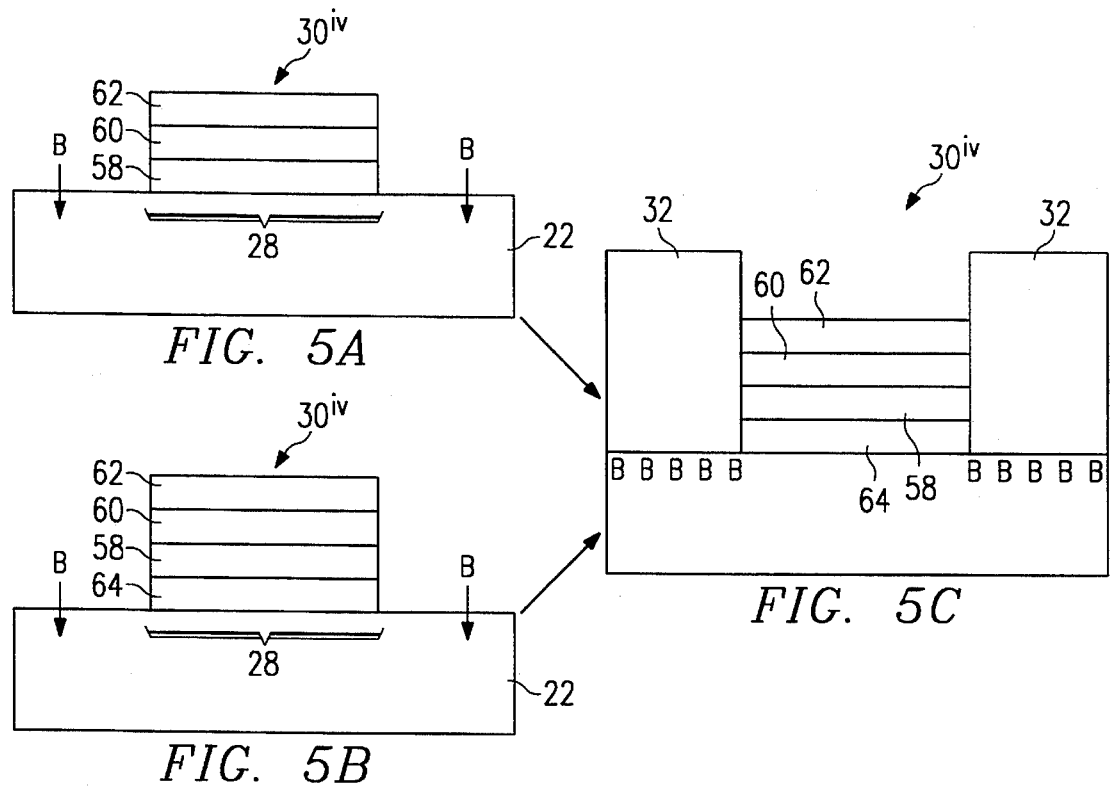
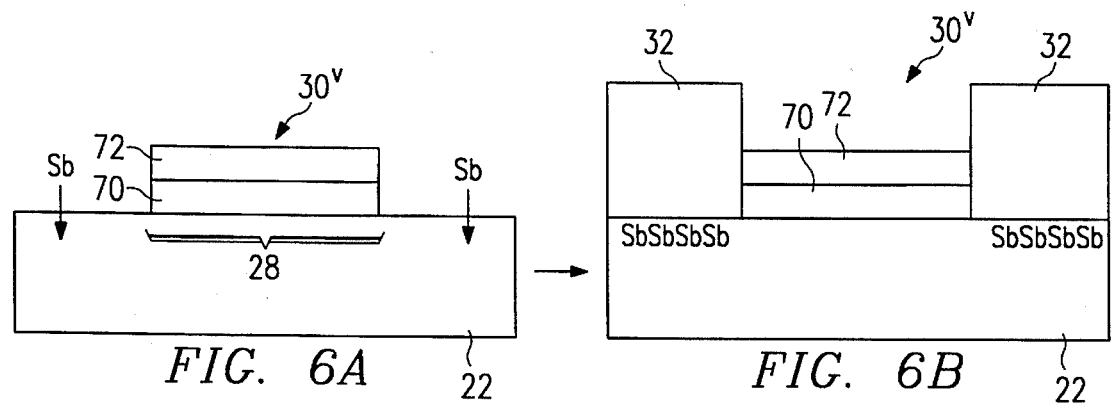

METHOD FOR REDUCING LATERAL DOPANT DIFFUSION

TECHNICAL FIELD OF THE INVENTION

This invention relates generally to the formation of integrated circuits, and more particularly to the diffusion of dopants in a semiconductor device, as would be undertaken during the formation of structures such as wells or active regions.

BACKGROUND OF THE INVENTION

The manufacture of integrated circuit devices involves the formation of n-wells, or regions, in a p-type substrate that are doped with an n-type impurity such as Phosphorus. These regions form the site where a p-channel transistor will be fabricated, while the regions lying outside of n-wells (called p-wells) provide a site for fabricating n-channel transistors. Both n-channel and p-channel transistors are required to implement CMOS technology.

The manufacture of integrated circuits involves the formation of active regions that are by separated distances of about 1μ or greater by field oxide layers with thicknesses on the order of 400–1200 nm. Transistors and other electrical structures are formed in the active regions. The field oxide provides for electrical isolation between separate and distinct electrical device regions on a die.

As the state of the art advances, a greater number of circuit components are to be provided on smaller surface areas of the die. However, as die size and die separation are reduced, it becomes increasingly difficult to maintain electrical isolation between electronic components formed on the die, due principally to the problem of diffusion of materials in a lateral direction when diffusion principally in the vertical direction is desired. The problem of lateral diffusion is particularly pertinent after implantation of the Boron channel stop, as the Boron tends to diffuse laterally from the silicon region under the field oxide layer into the active region where circuits are to be formed. The presence of Boron at the sides of the active region results in a diminution of the electrical channel width, resulting in reduced transistor drive current and increased N+ junction capacitance. Accordingly, it is desirable to minimize the extent of lateral diffusion of the Boron and other implants during field oxide formation.

It is well known that Boron, as well as Phosphorus, diffuses predominantly by interactions with silicon interstitials. However, Antimony is known to diffuse principally through interactions with lattice vacancies. Therefore, the manner in which the dopant diffuses into the semiconductor device affects not only the structure of the adjacent active regions into which the dopant diffuses, but also the measures that one can take to minimize the extent of dopant diffusion. For example, measures taken to inhibit Boron or Phosphorus lateral diffusion could not be expected to significantly impact upon lateral diffusion of Antimony, as Antimony diffuses by way of a different mechanism (vacancies) as opposed to Boron and Phosphorus (interstitials).

In conventional CMOS manufacture, the active regions are formed by a local oxidation process in which a thin layer of $SiO_2$ is grown in a diffusion furnace and a silicon nitride ($Si_3N_4$) layer is deposited by low pressure chemical vapor deposition ("LPCVD") over the $SiO_2$. The oxide/nitride stack functions as an oxidation blocking layer above what will become the active region of the device. Photoresist is applied to the top layer of the stack to define an active area pattern. The nitride layer is then plasma-etched using $CF_4$ or $CF_4$-based chemistry, for example. After the photoresist is removed, the wafer is oxidized to grow a thick field oxide in areas not protected by nitride. A field oxide layer is developed outside of the blocking layer. Prior to development of the field oxide, Boron is implanted into areas where the field oxide is to be grown, but not into active regions which are covered by an oxide/nitride/photoresist stack. However, as the Boron is driven vertically into the semiconductor device, the Boron freely diffuses laterally (by interstitials) into the active region, compromising region integrity for the development of circuit devices.

The problem of dopant diffusion during well drive-in is well documented. Lateral dopant diffusion of approximately 80% well depth is acknowledged in *CMOS Well Drive-In $NH_3$ for Reduced Lateral Diffusion and Heat Cycle*, IEEE Electron Device Letters, v. ed1–6, no. 12, Dec. 1985. The stated consequence of such undesired diffusion is an increase in the spacing requirement between the well and complementary MOSFET's outside of the well. The article reports retardation of lateral diffusion through the use of an ammonia ambient. In the disclosed process, a 150 nm-thick CVD $Si_3N_4$ layer is deposited on a 40 nm-thick stress-relief thermal $SiO_2$ layer. The $Si_3N_4$ layer is patterned and etched to define well regions that are then implanted with Phosphorus prior to removal of a photoresist layer from the surrounding region of the device. A 100 nm-thick $SiO_2$ layer is thermally grown in the well regions, after which the $Si_3N_4$ layer is removed with phosphoric acid. A dilute HF solution is applied to the $SiO_2$, which removes approximately 50 nm of $SiO_2$ for well drive-in. The disclosed drive-in is performed at 1,125° C. in either an $N_2$ or an $NH_3$ ambient. With reference to the ammonia ambient, the authors assert that silicon vacancies are generated at the $SiO_2$-substrate interface on the well regions where oxynitridation occurs, thus inhibiting lateral Phosphorus diffusion. Increased silicon vacancy concentration causes a decreased silicon interstitial concentration because the product of Si vacancies and Si interstitials is equal to an equilibrium constant. The reduced concentration of self-interstitials in the lateral direction is believed to inhibit lateral diffusion of Phosphorus.

More recently, the importance of scaling parasitic dimensions such as isolation regions and well dimensions has been addressed in *Reduction of Lateral Phosphorus Diffusion in CMOS n-Wells*, IEEE Transactions on Electron Devices, v. 37, no. 3, March 1990. Lateral diffusion of dopants during drive-in is identified as a primary factor that limits packaging density of semiconductor devices. Lateral diffusion of Phosphorus is reduced by creating silicon interstitial undersaturation in the region where the Phosphorus atoms diffuse laterally, as such Phosphorus atoms diffuse predominantly by interaction with self-interstitials. Lateral diffusion of Phosphorus is controlled by creating vacancy supersaturation arising from the decomposition reaction of $SiO_2$ ultimately to 2SiO, which results in the consumption of silicon atoms. For an n-well, vacancies are injected only outside of the well region, from the thin oxide, and virtually no vacancies are injected from the thick $SiO_2$-Si interface. Therefore, normal Phosphorus diffusion in the vertical direction proceeds, whereas lateral diffusion of Phosphorus into the region underlying the thin oxides is reduced due to the vacancy supersaturation.

SUMMARY OF THE INVENTION

An advantage of the present invention is that reduced lateral diffusion of dopant can be accomplished by applying films of differing chemical configurations over conductivity-dependent regions such as wells, well structures or active regions where circuit components such as transistors are fabricated. Lateral diffusion is suppressed by selectively infusing into the semiconductor body lattice vacancies or interstitials in accordance with the diffusion mechanism of the dopant being implanted. The teachings of the present invention are applicable to semiconductor devices that are formed from silicon, as well as those that are formed from other semiconductive materials, such as GaAs and HgCdTe. Selection of an appropriate film in conjunction with a particular dopant minimizes the extent of lateral dopant diffusion into the well region or into the active region of the device, thereby enhancing isolation of circuit components and allowing for a concomitant reduction in device size.

A process is provided for inhibiting lateral diffusion of dopants in a semiconductive material. At least one diffusion blocking layer or stack is provided along the semiconductor body so as to overlie the device well or active region, apart from a surrounding oxide layer. A dopant is selected for diffusion such that one of interstitial sites or vacancies is introduced into the material comprising the circuit component layer in accordance with the specific diffusion mechanism of the selected dopant. Dopant is diffused into the oxide layer in a direction that is substantially transverse to the upper surface of the semiconductor body, and the previously-introduced interstitial sites or vacancies serve to inhibit lateral diffusion of the dopant into the well or active region, thereby preserving the integrity of the well or active region for subsequent processing.

Interstitial sites or vacancies can be introduced into the active region or well by adjusting tile chemical composition of the overlying blocking layer, and thus the relationship between the blocking layer and the underlying semiconductor active region. For example, the blocking layer can include a silicon deficient film such as a silicon deficient silicon oxide ($SiO_x$), in which "x" is greater than 2, underlying a film of silicon nitride $Si_3N_4$. Alternatively, the blocking layer can include a silicon deficient oxynitride film having the composition $SiO_uN_v$ that underlies a silicon nitride film, in which "u" and "v" represent functional components selected to render a silicon deficient film. The blocking layer can alternatively include a silicon deficient film of the composition $Si_3N_y$, in which "y" represents a number greater than four, overlying an oxide film. The blocking layer can also comprise a silicon nitride film underlying an $SiO_2$ film which, in turn, underlies a film of $Si_3N_4$. The lowermost silicon nitride film can be deposited in an LPCVD process or can be deposited by plasma-enhanced deposition. Light nitridation, for example, forming a silicon nitride layer 2–20 nm thick, can optionally be applied prior to formation of the first film level of a blocking layer to further resist dopant lateral diffusion by injecting silicon vacancies. The vacancies arise from the consumption of silicon that arises from the formation of $Si_3N_4$. Nitridation can be accomplished in a furnace or a rapid thermal processor with ammonia gas at a temperature of about 800° C.–1200° C.

The teachings of the present invention are applicable during a number of semiconductor manufacturing processes, including well drive, well oxidation and field oxidation, to suppress dopant diffusion, as Boron and Phosphorus diffuse by common mechanisms (i.e., lateral diffusion is retarded by the injection of silicon vacancies into the silicon underlying the circuit component stack).

BRIEF DESCRIPTION OF THE DRAWINGS

These and other features of the invention will be apparent to those skilled in the art from a reading of the following detailed description of the invention, taken together with the accompanying drawings, in which:

FIGS. 3A–3C illustrate an alternative embodiment of formation of an active region in accordance with the present invention;

FIGS. 4A–4C illustrate a further alternative aspect of the invention;

FIGS. 5A–5C illustrate yet another aspect of active region formation in accordance with the present invention; and FIGS. 6A and 6B illustrate a further aspect of the invention.

DETAILED DESCRIPTION OF THE PREFERRED EMBODIMENTS

Figure 1A:
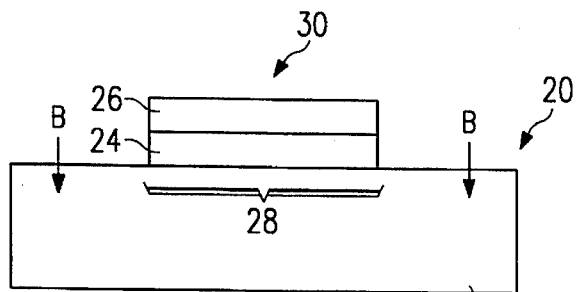
FIGS. 1A and 1B illustrate in sectional view and sequential manner the formation of an active region using LOCOS isolation, as is known in the prior art.

With reference to the drawings, wherein like reference characters represent corresponding views throughout the various illustrations, and in which the illustrated semiconductor components have not been depicted in scale for reasons of clarity of depiction and reader comprehension, and with particular reference to FIG. 1A, there is illustrated a sectional view of a CMOS semiconductor device, depicted generally by reference character 20, that is comprised of a body 22 of semiconductive material, such as silicon. The semiconductor body 22 can also be formed from a variety of semiconductive materials, such as GaAs and HgCdTe, for which the principles of the present invention that are set forth below are likewise applicable. The drawing illustrates a conventional manner of formation of an active region in the semiconductor device incident to field oxidation. In the prior art device, the active region is formed using a local oxidation ("LOCOS") in which a thin silicon oxide ($SiO_2$) film 24 is grown, typically in a diffusion furnace, over which is deposited a silicon nitride ($Si_3N_4$) film 26. The silicon nitride film is typically deposited by way of a low-pressure chemical vapor deposition ("LPCVD") process. The combination of the oxide 24 and nitride 26 films serve as a blocking layer or stack 30 above what will become the "active" region 28 of the device 20.

Figure 1B:
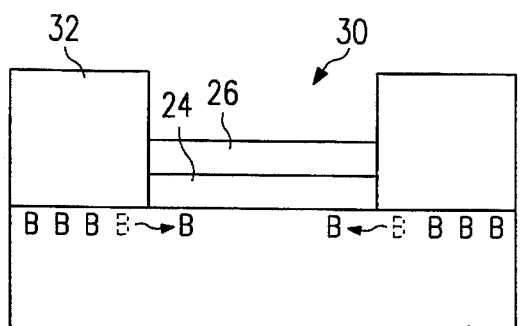

Boron is implanted into areas of the semiconductor body 22 where a field oxide is to be grown. A photoresist layer (not shown) is applied to the upper surface of a blocking layer or stack 30 before the stack is plasma-etched, and is left in place to block the Boron implant into the stack and underlying site of the active region. The field oxide 32 (FIG. 1B) is grown in a conventional manner, such as by way of steam oxidation, along the device 20 outside of the blocking layer 30 to a thickness of about 400–1200 nm. During field oxidation, Boron diffuses laterally into the active region, as indicated in phantom by reference character "B" in FIG. 1B, through interaction with silicon lattice interstitials in the active region. The same diffusion mechanism is applicable for other dopants, such as Phosphorus, that diffuse by way of lattice interstitials. Lateral migration can also occur with other dopants, such as Antimony, which diffuse by lattice vacancies. As will be described in detail below, such lateral diffusion, be it by way of lattice interstitials or vacancies, is inhibited in the present invention through the application of a blocking layer or stack which provides for modification of the underlying semiconductor active region molecular structures so as to introduce vacancies or interstitials that counter lateral dopant migration of the type described above.

Figure 2A:
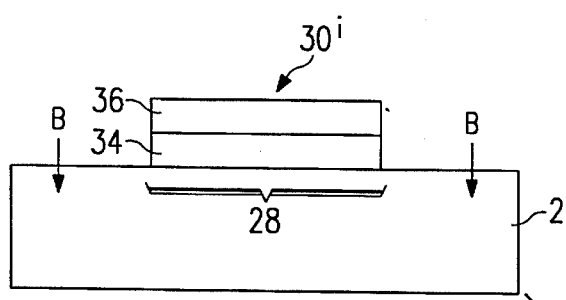
FIGS. 2A–2C illustrate in sectional view the sequences of forming an active region in a semiconductor device in accordance with the present invention.
Figure 2B:
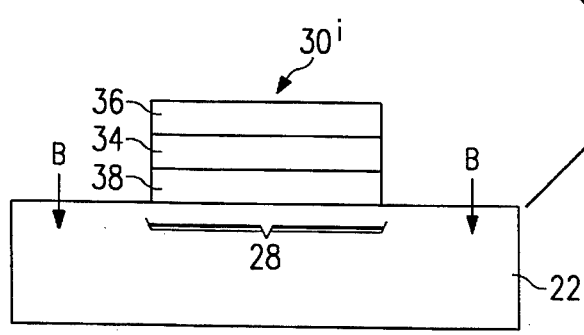
Figure 2C:
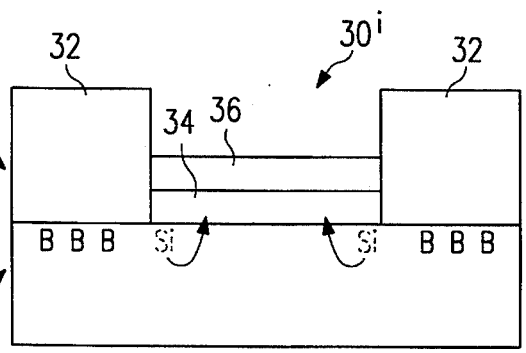

With reference to FIGS. 2A–2C, there is depicted an aspect of the invention that provides for inhibition of lateral diffusion of a dopant into the active region of a semiconductor device 22. With particular reference to FIG. 2A, the stack 30$^i$ is comprised of a silicon deficient film 34 of the composition $SiO_x$, in which x>2, which is applied to the semiconductor device 22 over what will be the active region 28. The silicon deficient film 34 can be applied in any of a variety of appropriate techniques, including plasma deposition. Overlying the silicon deficient film 34 is a film 36 of silicon nitride ($Si_3N_4$) that is deposited by low pressure chemical vapor deposition ("LPCVD"). At temperatures of on the order of 800° C. or greater, as are experienced, for example, during the course of thermal oxidation, the silicon deficient oxide absorbs silicon atoms from the underlying active regions, as indicated by the illustration of silicon atoms ("Si") in phantom (FIG. 2C), thereby creating vacancies in the vicinity of the active region 28 which serve to inhibit lateral Boron diffusion during field oxidation or inhibit lateral dopant diffusion during well oxidation in the manner described above. While the dopant dosage can vary in accordance with the selected dopant stage of processing, and the type of device being fabricated, a Boron dosage of about $1E13/cm^2$ is preferred for the channel stop step prior to field oxidation.

As used herein, the term "Boron" refers not only to the element Boron, but in addition thereto all elements and chemical compounds, such as Phosphorus, that can be used as dopants and which diffuse principally by way of interstitials.

In a further, alternative practice of this aspect of the invention, a thin silicon nitride film 38 (FIG. 2B) can be interposed between the semiconductor 22 and silicon deficient film 34. The nitride film 38 having a thickness of about 2–30 nm can be deposited in a conventional manner, as by low pressure chemical vapor deposition (LPCVD) at a temperature of approximately 800° C. The nitride film 38 is operable to inject vacancies into the silicon by out-diffusing the silicon into the film 38 and overlying silicon deficient film 34, as illustrated in FIGS. 2B and 2C. The injection of lattice vacancies inhibits lateral diffusion of the Boron, as the number of interstitials with which Boron can react is diminished in the active region 28.

In a further aspect of the invention, a stack 30$^{ii}$ (FIGS. 3A–3C) is provided with a silicon deficient oxynitride film 40 having the chemical composition $SiO_uN_v$, where u and v represent fractional components of oxygen and nitrogen, respectively, selected to render a silicon-deficient film. The oxynitride film 40 can be applied by any of a variety of conventional application techniques, such as adding an oxidant such as $N_2O$ during LPCVD nitride deposition or by using plasma deposition. Alternatively, the oxynitride film 40 can be produced by oxidizing the silicon and then treating the oxidized silicon with ammonia ($NH_3$) gas. Oxidation proceeds at a temperature of about 800° C.–1000° C. for a period of about 1–100 minutes in an oxygen-containing atmosphere. Ammonia gas treatment proceeds at a temperature of about 700° C.–1200° C. for a period of about 1–80 minutes. Overlying the oxynitride film 40 is a silicon nitride ($Si_3N_4$) film 42 that can be applied to the underlying oxynitride film 40 by any of a variety of conventional practices, such as low pressure chemical vapor deposition.

Alternatively, as illustrated in FIG. 3B, a nitride layer 44 can be interposed between the semiconductor device 22 and the oxynitride film 40 to further inject vacancies into the silicon 22 in the manner described above.

Following deposition of the blocking stack 30$^{ii}$, a photoresist (not shown) is applied to the uppermost silicon nitride film 42 and a suitable dopant, such as Boron or Phosphorus, is implanted into the semiconductor device 22, as illustrated in FIGS. 3A and 3B. The oxynitride film 40 and the optional nitride film 44 are operable to absorb silicon atoms from the underlying semiconductor body 22, as indicated in phantom FIG. 3C, thereby promoting the introduction of silicon lattice vacancies into the active region 28 of the semiconductor device underlying stack 30$^{ii}$. Following dopant implantation, the semiconductor device 22 is subjected to oxidation to develop a thick oxide on the order of 400–1200 nm, in the manner described above.

A further aspect of the invention is illustrated in FIGS. 4A–4C. With reference to FIG. 4A, there is depicted a blocking layer or stack 30$^{iii}$ that is comprised of an oxide film 50 of the composition $SiO_2$ or $SiO_x$, where x represents a number or fractional component selected to render a silicon deficient film, that underlies a silicon deficient silicon nitride film 52 of the composition $Si_3N_y$, where y>4. The underlying oxide 50 can be applied by thermal oxidation, plasma-assisted deposition, as well as other suitable oxidation procedures. The silicon nitride film 52 can be applied by way of any of a variety of conventional processes, including plasma deposition, plasma assisted chemical vapor deposition or by low pressure chemical vapor deposition using a high ratio of $NH_3:SiH_2Cl_2$ [Dichloro Silane Gas ("DCS")]. The $NH_3:DCS$ ratio is preferably on the order of about 10:1 or greater. The silicon nitride film 52 absorbs silicon atoms from the underlying oxide 50 which, in turn, absorbs silicon atoms from the active region 28 underlying the stack 30$^{iii}$, as shown in FIG. 4C. As is the case with the silicon deficient blocking layers or stacks 30$^i$ and 30$^{ii}$, the blocking layer 30$^{iii}$ can be provided with a nitride film 54 which underlies the oxide film 50 (FIG. 4B) to facilitate silicon absorption into the nitride and oxide films 54 and 50, respectively, upon exposure to temperatures in excess of about 800° C.

A further aspect of the invention is illustrated in FIGS. 5A–5C. In this aspect of the invention, the blocking layer or stack 30$^{iv}$ comprises a thin (about 2–50 nm) film of silicon nitride ($Si_3N_4$) 58 that underlies a film 60 of silicon dioxide $SiO_2$. A silicon nitride $Si_3N_4$ film 62 is applied to the underlying silicon dioxide film 60 by low pressure chemical vapor deposition. Tile lower-most silicon nitride film 60 can be applied by either low pressure chemical vapor deposition or by plasma-enhanced deposition. In instances where plasma-enhanced deposition is used, it is desirable to apply the nitride film 58 as a silicon deficient film so as to facilitate silicon absorption from the region 28 underlying the applied film. The composition of stack 30$^{iv}$ allows for the use of nitride stress to further suppress Boron lateral diffusion. The stress arises from the disparity in expansion coefficients between $Si_3N_4$ and Si at the top of the semiconductor body 28 when the body 28 and stack 30$^{iv}$ are thermally processed. Nitride stress results in the depletion of Si self-interstitials at the surface of tile Si semiconductor body 22 adjacent to the active region 28, thus inhibiting Boron lateral diffusion.

With reference to FIGS. 6A and 6B, there is depicted an exemplary stack composition 30$^v$ for use in conjunction with an Antimony dopant. As used herein, the term "Antimony" refers not only to the element identified from the Periodic Table by that name, but in addition thereto all elements and chemical components which can be used as semiconductor dopants and which diffuse principally by way of lattice vacancies. A silicon-rich oxide 70 having a composition $SiO_x$, in which x<2, is applied using plasma deposition to the semiconductor body 22 over what will become the active region 28. A silicon nitride film 72 is applied over the oxide film 70 by any of a variety of conventional processes, including plasma deposition, plasma assisted chemical vapor deposition, and low pressure chemical vapor deposition. The silicon nitride can also be applied via an LPCVD of a mixture of $NH_3$ and DCS in the manner described previously. The ratio of $NH_3$ and DCS can be adjusted to vary the stoichiometry of the deposited film. As the formation of vacancies in the semiconductor lattice of body 22 is inhibited by the presence of the silicon-rich film 70, lateral diffusion of Antimony into the active region is inhibited during well drive and oxidation processing steps (FIG. 6B).

In addition to use of the principles of the subject invention described above to suppress lateral Boron diffusion during field oxidation, all of the foregoing techniques and processes can likewise be applied during n-well drive and oxidation, as the diffusivity of Phosphorus n-well dopant is retarded by silicon vacancy injection.

Although the present invention and its advantages have been described in connection with the preferred embodiments, it should be understood that various changes, substitutions and alterations can be made herein without departing from the spirit and scope of the invention as defined by the appended claims.

What is claimed is:

1. A process for inhibiting lateral diffusion of a dopant in a semiconductor, comprising the steps of:
   a) providing a semiconductor body having an upper surface and at least one active region development area;
   b) applying, in overlying relation with said at least one active region development area, a dopant blocking layer comprising a film that is formed from an oxide and a nitride so as to render said blocking layer non-stoichiometric and silicon deficient;
   c) absorbing into said blocking layer silicon atoms from said semiconductor body, thereby creating lattice vacancies in the vicinity of said active region; and
   d) inhibiting with said lattice vacancies lateral diffusion of an applied dopant.

2. A process for inhibiting lateral diffusion of a dopant in a semiconductor, comprising the steps of:
   a) providing a semiconductor body having an upper surface and at least one active region development area;
   b) applying, in overlying relation with said at least one active region development area, a dopant blocking layer comprising a film that is formed from an oxide and a nitride so as to render said blocking layer non-stoichiometric and silicon rich;
   c) suppressing with said blocking layer absorption into said blocking layer of silicon atoms from said semiconductor body, thereby suppressing the formation of lattice vacancies in the vicinity of said active region and inhibiting lateral diffusion of an applied dopant.

3. The process according to claim 1 wherein said blocking layer comprises a stack having a silicon deficient $SiO_x$ film, in which x>2, underlying a silicon nitride film.

4. The process according to claim 3, wherein said silicon nitride film is formed as a silicon deficient film.

5. The process according to claim 1 wherein said blocking layer includes a silicon deficient oxynitride film having a composition $SiO_uN_v$ underlying a silicon nitride film, where u and v represent fractional components selected to render a silicon deficient film.

6. The process according to claim 1 wherein said blocking layer includes a silicon deficient $Si_3N_y$ film, in which y>4, overlying an oxide film.

7. The process according to claim 1 wherein said blocking layer includes a silicon nitride film underlying an $SiO_2$ layer which, in turn, underlies a film of $Si_3N_4$.

8. The process according to claim 7, wherein at least one of said silicon nitride layers is deposited by one of an LPCVD or plasma-enhanced deposition process.

9. The process according to any one of claims 3–6, further comprising the step of applying a nitride film to said semiconductor body prior to application to said semiconductor body of any other film.

10. The process to either of claims 3 or 4, wherein said silicon deficient silicon oxide film is plasma-deposited and said silicon nitride film is deposited in an LPCVD process.

11. The process according to claim 1, further comprising the step of applying the recited process during an n-well drive.

12. The process according to claim 1 further comprising the step of applying an oxide layer adjacent to said blocking layer.

13. The process according to claim 2 wherein said dopant is selected from the group of chemical elements and compounds that diffuse into said semiconductor body principally by way of lattice vacancies.

* * * * *